United States Patent
Yu et al.

(10) Patent No.: US 7,482,245 B1
(45) Date of Patent: Jan. 27, 2009

(54) STRESS PROFILE MODULATION IN STI GAP FILL

(75) Inventors: Jengyi Yu, San Ramon, CA (US); Chi-I Lang, Sunnyvale, CA (US); Judy H. Huang, Los Gatos, CA (US)

(73) Assignee: Novellus Systems, Inc., San Jose, CA (US)

( * ) Notice: Subject to any disclaimer, the term of this patent is extended or adjusted under 35 U.S.C. 154(b) by 296 days.

(21) Appl. No.: 11/471,958

(22) Filed: Jun. 20, 2006

(51) Int. Cl.
*H01L 21/76* (2006.01)

(52) U.S. Cl. ............... 438/435; 438/424; 257/E21.545

(58) Field of Classification Search ............... 438/424, 438/435; 257/E21.45, E21.545
See application file for complete search history.

(56) References Cited

U.S. PATENT DOCUMENTS

| | | | |
|---|---|---|---|
| 4,361,461 A | 11/1982 | Chang | |
| 5,129,958 A | 7/1992 | Nagashima et al. | |
| 5,227,191 A | 7/1993 | Nagashima | |
| 5,246,885 A | 9/1993 | Braren et al. | |
| 5,252,178 A | 10/1993 | Moslehi | |
| 5,270,264 A | 12/1993 | Andideh et al. | |
| 5,282,925 A | 2/1994 | Jeng et al. | |
| 5,342,801 A | 8/1994 | Perry et al. | |
| 5,385,857 A | 1/1995 | Solo de Zaldlvar | |
| 5,494,854 A | 2/1996 | Jain | |
| 5,516,729 A | 5/1996 | Dawson et al. | |
| 5,532,516 A | 7/1996 | Pasch et al. | |
| 5,621,241 A | 4/1997 | Jain | |
| 5,622,894 A | 4/1997 | Jang et al. | |
| 5,636,320 A | 6/1997 | Yu et al. | |
| 5,641,545 A | 6/1997 | Sandhu | |
| 5,702,982 A | 12/1997 | Lee et al. | |
| 5,705,419 A | 1/1998 | Perry et al. | |
| 5,711,998 A | 1/1998 | Shufflebotham | |
| 5,789,818 A | 8/1998 | Havermann | |
| 5,834,068 A | 11/1998 | Chern et al. | |

(Continued)

FOREIGN PATENT DOCUMENTS

JP  2003-031649  1/2003

OTHER PUBLICATIONS

U.S. Offica Action mailed May 9, 2007, for U.S. Appl. No. 10/991,890.

(Continued)

*Primary Examiner*—Bradley K Smith
(74) *Attorney, Agent, or Firm*—Weaver Austin Villeneuve & Sampson LLP

(57) ABSTRACT

High density plasma (HDP) techniques form silicon oxide films having sequentially modulated stress profiles. The HDP techniques use low enough temperatures to deposit silicon oxide films in transistor architectures and fabrication processes effective for generating channel strain without adversely impacting transistor integrity. Methods involve partially filling a trench on a substrate with a portion of deposited dielectric using a high density plasma chemical vapor deposition process. The conditions of the process are configured to produce a first stress condition in the first portion of the deposited dielectric. The deposition process condition may then be modified to produce a different stress condition in deposited dielectric. The partially-filled trench may be further filled using the modified deposition process to produce additional dielectric and can be repeated until the trench is filled. Transistor strain can be generated in NMOS or PMOS devices using stress profile modulation in STI gap fill.

22 Claims, 6 Drawing Sheets

U.S. PATENT DOCUMENTS

| | | | |
|---|---|---|---|
| 5,851,344 | A | 12/1998 | Xu et al. |
| 5,858,876 | A | 1/1999 | Chew |
| 5,869,902 | A | 2/1999 | Lee et al. |
| 5,872,058 | A | 2/1999 | Van Cleemput et al. |
| 5,897,370 | A | 4/1999 | Joshi et al. |
| 5,910,020 | A | 6/1999 | Yamada |
| 5,911,133 | A | 6/1999 | Yao et al. |
| 5,913,140 | A | 6/1999 | Roche et al. |
| 5,920,792 | A | 7/1999 | Lin |
| 5,937,323 | A | 8/1999 | Orezyk et al. |
| 5,953,635 | A | 9/1999 | Andideh |
| 5,962,923 | A | 10/1999 | Xu et al. |
| 5,963,840 | A | 10/1999 | Xia et al. |
| 5,968,610 | A | 10/1999 | Liu et al. |
| 5,972,192 | A | 10/1999 | Dubin et al. |
| 6,027,663 | A | 2/2000 | Martin et al. |
| 6,030,881 | A | 2/2000 | Papasouliotis et al. |
| 6,037,018 | A | 3/2000 | Jang et al. |
| 6,077,451 | A | 6/2000 | Takenaka et al. |
| 6,077,574 | A | 6/2000 | Usami |
| 6,100,205 | A | 8/2000 | Liu et al. |
| 6,106,678 | A | 8/2000 | Shufflebotham et al. |
| 6,124,211 | A | 9/2000 | Butterbaugh et al. |
| 6,136,703 | A | 10/2000 | Vaartstra |
| 6,149,779 | A | 11/2000 | Van Cleemput |
| 6,184,158 | B1 | 2/2001 | Shufflebotham et al. |
| 6,200,412 | B1 | 3/2001 | Kilgore et al. |
| 6,211,065 | B1 | 4/2001 | Xi et al. |
| 6,232,196 | B1 | 5/2001 | Raaijmakers et al. |
| 6,265,269 | B1 | 7/2001 | Chen et al. |
| 6,277,764 | B1 | 8/2001 | Shin et al. |
| 6,331,494 | B1 | 12/2001 | Olson et al. |
| 6,335,261 | B1 | 1/2002 | Natzle et al. |
| 6,395,150 | B1 | 5/2002 | Van Cleemput et al. |
| 6,400,023 | B2 | 6/2002 | Huang |
| 6,410,446 | B1 | 6/2002 | Tsai et al. |
| 6,451,705 | B1 | 9/2002 | Trapp et al. |
| 6,479,361 | B1 | 11/2002 | Park |
| 6,479,396 | B1 | 11/2002 | Xu et al. |
| 6,486,081 | B1 | 11/2002 | Ishikawa et al. |
| 6,500,728 | B1 | 12/2002 | Wang |
| 6,531,377 | B2 | 3/2003 | Knorr et al. |
| 6,566,229 | B2 | 5/2003 | Hong et al. |
| 6,569,777 | B1 | 5/2003 | Hsu et al. |
| 6,596,653 | B2 | 7/2003 | Tan et al. |
| 6,596,654 | B1 | 7/2003 | Bayman et al. |
| 6,599,829 | B2 | 7/2003 | Smith et al. |
| 6,617,207 | B1 | 9/2003 | Kiryu et al. |
| 6,642,105 | B2 | 11/2003 | Kim et al. |
| 6,706,541 | B1 | 3/2004 | Toprac et al. |
| 6,737,334 | B2 | 5/2004 | Ho et al. |
| 6,787,483 | B1 | 9/2004 | Bayman et al. |
| 6,794,290 | B1 | 9/2004 | Papasouliotis et al. |
| 6,808,748 | B2 | 10/2004 | Kapoor et al. |
| 6,812,043 | B2 | 11/2004 | Bao et al. |
| 6,821,905 | B2 | 11/2004 | Pan et al. |
| 6,846,391 | B1 | 1/2005 | Papasouliotis et al. |
| 6,846,745 | B1 | 1/2005 | Papasouliotis et al. |
| 6,852,639 | B2 | 2/2005 | Rudolph et al. |
| 6,867,086 | B1 | 3/2005 | Chen et al. |
| 6,903,031 | B2 | 6/2005 | Karim et al. |
| 6,958,112 | B2 | 10/2005 | Karim et al. |
| 7,001,854 | B1 | 2/2006 | Papasouliotis et al. |
| 7,067,440 | B1 | 6/2006 | Bayman et al. |
| 7,078,312 | B1 | 7/2006 | Sutanto et al. |
| 7,122,485 | B1 | 10/2006 | Papasouliotis et al. |
| 7,148,155 | B1 | 12/2006 | Tarafdar et al. |
| 7,163,896 | B1 | 1/2007 | Zhu et al. |
| 7,176,039 | B1 | 2/2007 | Papasouliotis et al. |
| 7,211,525 | B1 | 5/2007 | Shanker et al. |
| 7,217,658 | B1 | 5/2007 | Bayman et al. |
| 2001/0001175 | A1* | 5/2001 | Narwankar et al. ......... 118/300 |
| 2001/0019903 | A1 | 9/2001 | Shufflebotham et al. |
| 2001/0044203 | A1 | 11/2001 | Huang et al. |
| 2002/0052119 | A1 | 5/2002 | Van Cleemput |
| 2002/0084257 | A1 | 7/2002 | Bjorkman et al. |
| 2002/0179570 | A1 | 12/2002 | Mathad et al. |
| 2002/0187657 | A1 | 12/2002 | Morozumi |
| 2003/0003244 | A1 | 1/2003 | Rossman |
| 2003/0003682 | A1 | 1/2003 | Moll et al. |
| 2003/0087506 | A1 | 5/2003 | Kirchhoff |
| 2003/0165632 | A1 | 9/2003 | Lin et al. |
| 2003/0203652 | A1 | 10/2003 | Bao et al. |
| 2003/0207580 | A1 | 11/2003 | Li et al. |
| 2004/0020894 | A1 | 2/2004 | Williams et al. |
| 2004/0058549 | A1 | 3/2004 | Ho et al. |
| 2004/0082181 | A1 | 4/2004 | Doan et al. |
| 2004/0110390 | A1 | 6/2004 | Takagi et al. |
| 2004/0241342 | A1 | 12/2004 | Karim et al. |
| 2005/0074946 | A1 | 4/2005 | Chu et al. |
| 2005/0130411 | A1 | 6/2005 | Bao et al. |
| 2005/0136576 | A1 | 6/2005 | Ishihara et al. |
| 2005/0136686 | A1 | 6/2005 | Kim et al. |
| 2005/0250346 | A1 | 11/2005 | Schmitt |
| 2005/0255667 | A1* | 11/2005 | Arghavani et al. .......... 438/405 |
| 2007/0054504 | A1* | 3/2007 | Chen et al. .................. 438/787 |
| 2007/0204907 | A1* | 9/2007 | Strang .......................... 137/2 |

OTHER PUBLICATIONS

U.S. Office Action mailed May 16, 2007, from U.S. Appl. No. 11/159,834.

U.S. Office Action mailed Aug. 6, 2003, from U.S. Appl. No. 10/058,897.

U.S. Office Action mailed Jan. 29, 2004, from U.S. Appl. No. 10/058,897.

U.S. Office Action mailed May 21, 2004, from U.S. Appl. No. 10/058,897.

U.S. Office Action mailed Aug. 10, 2004, from U.S. Appl. No. 10/271,333.

U.S. Office Action mailed Apr. 14, 2005, from U.S. Appl. No. 10/271,333.

U.S. Office Action mailed Jun. 29, 2005, from U.S. Appl. No. 10/728,569.

Gauri et al., "Method of Preventing Structures Erosion During Multi-Step Gap Fill", Novellus Systems, Inc., filed Dec. 4, 2003, U.S. Appl. No. 10/728,569, pp. 1-29.

U.S. Office Action mailed Jan. 7, 2005, from U.S. Appl. No. 10/728,569.

U.S. Office Action mailed Nov. 6, 2002, from U.S. Appl. No. 09/996,619.

U.S. Office Action mailed Mar. 2, 2004, from U.S. Appl. No. 10/442,846.

U.S. Office Action mailed Jul. 25, 2005, from U.S. Appl. No. 10/890,655.

U.S. Office Action mailed Apr. 30, 2004, from U.S. Appl. No. 10/389,164.

U.S. Office Action mailed Jun. 17, 2004, from U.S. Appl. No. 10/654,113.

U.S. Office Action mailed Dec. 2, 2004, from U.S. Appl. No. 10/654,113.

U.S. Office Action mailed Mar. 31, 2005, from U.S. Appl. No. 10/654,113.

Bayman et al., "Process Modulation to Prevent Structure Erosion During Gap Fill", Novellus Systems, Inc., filed Sep. 7, 2004, U.S. Appl. No. 10/935,909, pp. 1-30.

Papasouliotis et al., "Dynamic Modification of Gap-Fill Process Characteristics", Novellus Systems, Inc., filed Sep. 21, 2004, U.S. Appl. No. 10/947,424, pp. 1-25.

Hook et al., "The Effects of Fluorine on Parametrics and Reliability in a 0.18-μm 3.5/6.8 nm Dual Gate Oxide CMOS Technology", IEEE Transactions on Electron Devices, vol. 48, No. 7., Jul. 2001, pp. 1346-1353.

Shanker et al., "Hydrogen Treatment Enhanced Gap Fill", Novellus Systems, Inc., filed Mar. 16, 2005, U.S. Appl. No. 11/082,369, pp. 1-33.

U.S. Office Action mailed Jan. 27, 2005, from U.S. Appl. No. 10/316,987.

U.S. Office Action mailed Jul. 14, 2005, from U.S. Appl. No. 10/316,987.

Zhu et al., "Biased $H_2$ Etch Process In Deposition-Etch-Deposition Gap Fill", Novellus Systems, inc., filed Dec. 10, 2003, U.S. Appl. No. 10/733,858, pp. 1-28.

U.S. Office Action mailed Apr. 19, 2005, from U.S. Appl. No. 10/733,858.

U.S. Office Action mailed Oct. 7, 2005, from U.S. Appl. No. 10/733,858.

Lang et al., "Helium-Based Etch Process in Deposition-Etch-Deposition Gap Fill", Novellus Systems, Inc., filed Jun. 22, 2005, U.S. Appl. No. 11/159,834, pp. 1-29.

U.S. Office Action mailed Nov. 17, 2005, from U.S. Appl. No. 10/316,987.

Lang et al., "Strain Engineering—HDP Thin Film With Tensile Stress For FEOL and Other Applications", Novellus Systems, Inc., filed Nov. 17, 2004, U.S. Appl. No. 10/991,890, pp. 1-35.

U.S. Office Action mailed Oct. 18, 2005, from U.S. Appl. No. 10/947,424.

Lang et al., "Using Water (H20) To Replace Oxygen (02) In A Silicon Dioxide (Si02) Thin Film Deposition Process for HDP STI Technology", Novellus Systems, Inc., filed Nov. 9, 2005, U.S. Appl. No. 11/272,487, pp. 1-25.

U.S. Office Action mailed Dec. 14, 2005, from U.S. Appl. No. 10/728,569.

Nguyen et al., "Halogen-Free Noble Gas Assisted $H_2$ Plasma Etch Process in Deposition-Etch-Deposition Gap Fill", Novellus Systems, Inc., filed Mar. 1, 2006, U.S. Appl. No. 11/366,220.

U.S. Office Action mailed Feb. 16, 2006, from U.S. Appl. No. 11/082,369.

U.S. Office Action mailed Mar. 24, 2006, from U.S. Appl. No. 10/733,858.

U.S. Office Action mailed Jun. 1, 2006, from U.S. Appl. No. 10/728,569.

U.S. Office Action mailed Apr. 19, 2006, from U.S. Appl. No. 10/947,424.

U.S. Office Action mailed Sep. 29, 2006, from U.S. Appl. No. 11/082,369.

U.S. Office Action mailed Oct. 2, 2006, from U.S. Appl. No. 10/935,909.

\* cited by examiner

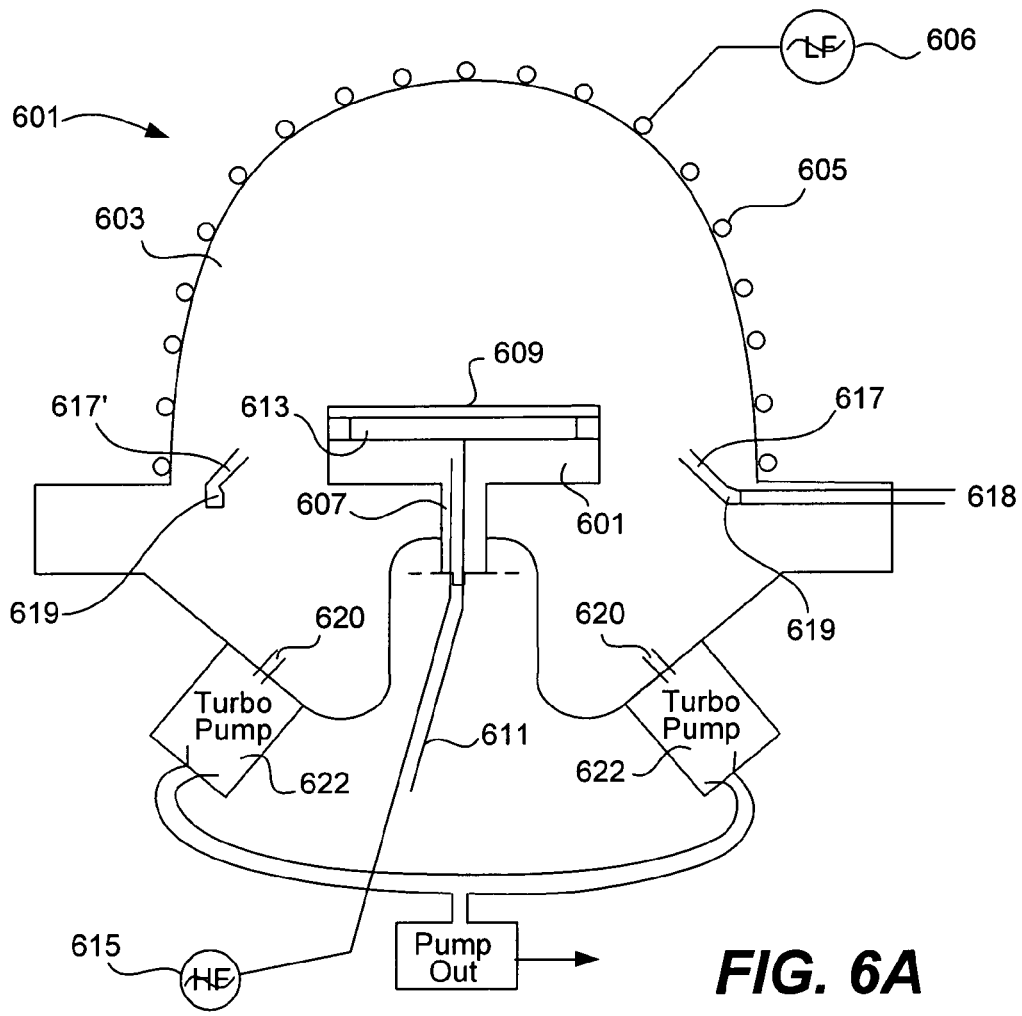
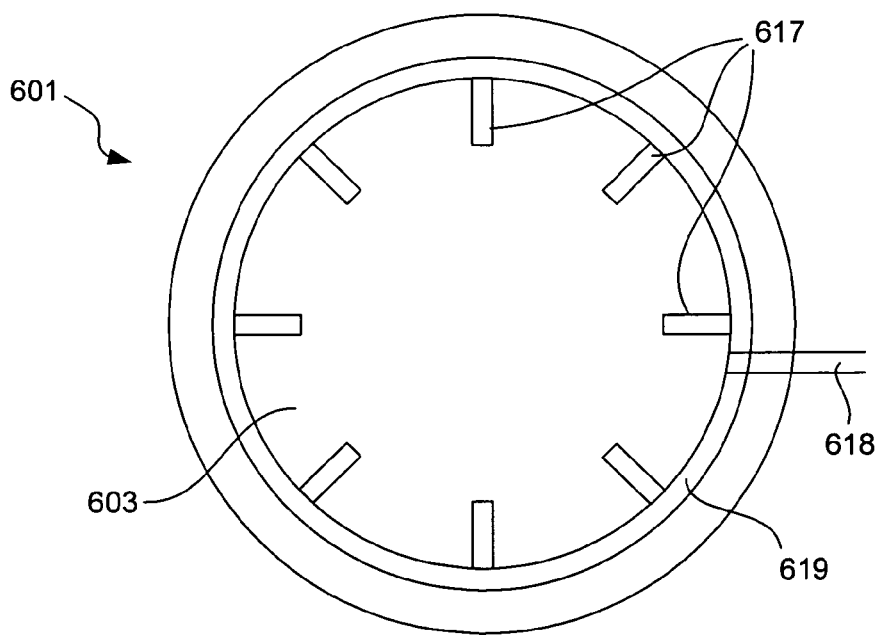

STRESS PROFILE MODULATION IN STI GAP FILL

FIELD OF THE INVENTION

This invention relates to high density plasma (HDP) deposition techniques for forming silicon oxide films. The methods can be used to tailor stress in deposited silicon oxide films in transistor architectures to control channel strain.

BACKGROUND

As transistors are scaled to smaller dimensions there is a need for higher switching speeds. One solution to increase transistor speed is to strain the silicon in the channel. Adding a small amount of strain to the silicon lattice structure promotes higher electron and hole mobilities, which increase transistor drain current and device performance.

When the lattice is under tensile strain, its physical symmetry is broken, and with it the electronic symmetry. The lowest energy level of the conduction band is split, with two of the six original states dropping to a lower energy level and four rising to a higher energy level. This renders it more difficult for the electrons to be 'scattered' between the lowest energy states by a phonon, because there are only two states to occupy. Whenever electrons scatter, it randomizes their motion. Reducing scatter increases the average distance an electron can travel before it is knocked off course, increasing its average velocity in the conduction direction. Also, distorting the lattice through tensile strain can distort the electron-lattice interaction in a way that reduces the electron's effective mass, a measure of how much it will accelerate in a given field. As a result, electron transport properties like mobility and velocity are improved and channel drive current for a given device design is increased in a strained silicon channel, leading to improved transistor performance.

High tensile films have recently been introduced to the transistor device manufacturing process. For example, highly tensile silicon nitride capping layers have been used in NMOS structures to induce tensile strain in the NMOS channel region. The stress from this capping layer is uniaxially transferred to the NMOS channel through the source-drain regions to create tensile strain in the NMOS channel. However, highly tensile silicon nitride capping layers are generally deposited using thermal CVD processes, which may consume too much of thermal budget for advanced transistor architectures. In addition, silicon nitride capping layers are not appropriate for use in PMOS structures where it is preferable to have compressive strain in the PMOS channel region.

Additionally, biaxial strained silicon may also be achieved through the deposition of Si and silicon germanium (SiGe) epilayers, but is a costly process. Moreover, strained Si on SiGe epilayers utilize thick, complex, and defect containing buried SiGe layers (such as graded buffer layers where the Ge content is increased from 0% up to the targeted Ge concentration, typically 20%) in order to provide a template for a relaxed SiGe layer of constant Ge content. This layer becomes a virtual substrate for the strained Si epitaxy of which Ge diffusion, strain relaxation, and creation and propagation of misfit and threading dislocations are only some of the limitations that prevent it from being flexible for strain engineering.

Accordingly, new transistor architectures and fabrication processes for generating and modulating channel strain are needed.

SUMMARY OF THE INVENTION

The present invention addresses this need by providing methods for forming silicon oxide films using high density plasma (HDP) CVD techniques. The methods can be used to tailor stress in deposited dielectric films in transistor architectures to generate and modulate channel strain without adversely impacting the efficiency of the transistor fabrication process.

In preferred embodiments, the methods involve partially filling a trench on a substrate with a portion of deposited dielectric using a high density plasma chemical vapor deposition process. The conditions of the process are configured to produce a first stress condition in the first portion of the deposited dielectric. The deposition process condition may then be modified to produce a different stress condition in deposited dielectric. The partially-filled trench may be further filled using the modified deposition process to produce additional dielectric having the different stress condition and can be repeated until the trench is filled. Transistor strain can be generated in NMOS or PMOS devices using stress profile modulation in STI gap fill. Example applications include high tensile stress silicon oxides for use in shallow trench isolation structures, pre-metal dielectric layer and silicon on insulator substrates.

Modulation of the stresses in the deposited dielectric may be achieved by varying the substrate temperature during deposition. The substrate temperature can be controlled by varying the backside helium pressure or through the use of resistive heating and coolant. By varying the substrate temperature during the deposition, the hydrogen content in the deposited film and silicon lattice of the substrate are modulated accordingly to achieve tensile stress in the deposited film after post deposition treatments. The pressure may be varied in any known manner, such as a step-by-step variation and/or gradually ramped in each stress profile modulation layer to achieve the desired stress condition.

These and other aspects and advantages of the invention are described further below and with reference to the drawings.

BRIEF DESCRIPTION OF THE DRAWINGS

FIGS. 6A-6B is a schematic representation of high density plasma apparatus suitable for methods in accordance with embodiments of the invention.

DETAILED DESCRIPTION OF THE INVENTION

Figure 1:
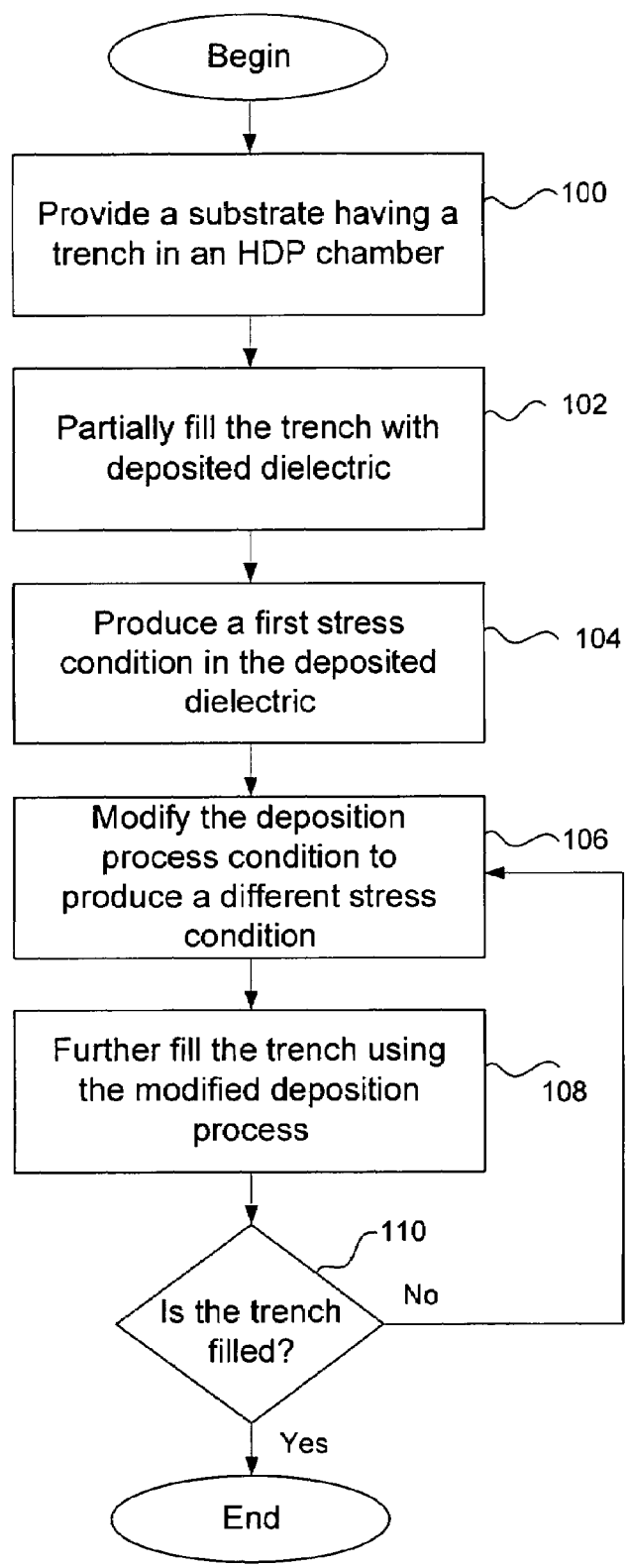
FIG. 1 is a flowchart illustrating a method of forming an STI feature in accordance with the present invention.

Reference will now be made in detail to specific embodiments of the invention. Examples of the specific embodiments are illustrated in the accompanying drawings. While the invention will be described in conjunction with these specific embodiments, it will be understood that it is not intended to limit the invention to such specific embodiments.

On the contrary, it is intended to cover alternatives, modifications, and equivalents as may be included within the spirit and scope of the invention as defined by the appended claims. In the following description, numerous specific details are set forth in order to provide a thorough understanding of the present invention. The invention may be practiced without some or all of these specific details. In other instances, well known process operations have not been described in detail in order not to unnecessarily obscure the present invention.

Methods of the invention can be used to produce high tensile stress oxide films useful in semiconductor wafer fabrication, especially in applications for improving strained silicon transistor architectures. Some specific example transistor applications are described below with reference to FIG. 5. Methods of the invention, however, are not limited to these transistor applications, or any other particular application. Note that to the extent that the invention applies to semiconductor wafer fabrication, the words "wafer", "wafer substrate" and "substrate" will be used interchangeably and the words "film" and "layer" will be used interchangeably herein.

Methods of the invention are especially useful in front-end-of-line (FEOL) processes in semiconductor wafer fabrication. Examples include dielectric gap fill applications such as shallow-trench isolation (STI) structures and pre-metal dielectric (PMD) layers, as well as silicon-on-insulator (SOI) dielectric applications.

High density plasma chemical vapor deposition (HDP-CVD or HDP) techniques are typically the method of choice for many gap fill deposition applications because they can provide void-free high-quality dielectric films, even in high aspect ratio device structures. The basis for the improved gap filling capability is that HDP sources can provide a high density of low energy ions to the wafer surface. The ions can simultaneously sputter the film during CVD deposition. The sputtering can remove material from some regions on the wafer surface more rapidly than other regions, resulting in films that can fill narrow gaps with no voids.

HDP methods are not only used in gap filling depositions. In many traditional HDP applications, gap fill or otherwise, silicon oxide films are deposited with the goal of attaining dense films. Unlike other deposition processes, HDP techniques can be used to produce dense films. For example, HDP methods can produce silicon oxide films as dense as thermally deposited silicon oxide. These dense films can be produced because the ion bombardment aspect of HDP has the effect of densifying growing film. Any voids formed on the surface regions of the film during deposition are forced out by the energy of the bombarding ions. With densification comes compressive stress. Compressive stress is created by the compaction of the silicon oxide network of the film.

Methods of the present invention focus on using HDP methods to modulate and control the stress produced in dielectric films, including producing films with regions of high tensile stress. The deposited dielectric film can be silicon dioxide, silicon nitride, silicon oxynitride, or doped silicon oxide materials (e.g., PSG, FSG). In contrast to compressive stress, tensile stress is the stress state of a material leading to expansion of the internal atomic network. For silicon oxide films, tensile stress leads to the expansion of the silicon oxide network. However, since HDP methods are used to deposit the film, the densifying effects of the high density plasma still produce a relatively dense film compared to films produced using standard CVD or PECVD deposition techniques. Thus, the present invention allows one to produce relatively dense silicon oxide films that possess a range of stresses, from highly compressive to highly tensile.

Tensile and compressive stress can be measured in force divided by units of area, usually dynes/cm$^2$ or N/cm$^2$, and are well defined within the art and will not be discussed in detail herein. Any suitable method for measuring compressive and tensile stress may be used. For example, standards for measuring compressive and tensile stress of materials described by the American Society for Testing and Materials (ASTM) may be used. Measures of compressive and tensile stress presented herein may be made with any suitable apparatus including a KLA-Tencor Flix or FSM stress gauge device.

In accordance with the present invention, a STI feature with a modulated stress profile is provided by an HDP-CVD based technique. The method of forming a STI feature includes a substrate with a trench to be filled in an HDP reaction chamber. The trench may be partially filled with a portion of deposited dielectric using a high density plasma chemical vapor deposition process. The conditions of the process are configured to produce a first stress condition in the first portion of the deposited dielectric. The deposition process condition may then be modified to produce a different stress condition in deposited dielectric. The partially-filled trench may be further filled using the modified deposition process to produce additional dielectric having the different stress condition and can be repeated to produce additional dielectric until the trench is filled.

The stress conditions applied to the deposited dielectric may either be compressive stress or tensile stress as described above. Additionally, the stresses may be sequentially modulated such that a user may apply a stress in any profile desired. For exemplary purposes only and not intended to be limiting, the first stress condition applied may be compressive stress and a second stress condition applied may be tensile stress or vice versa. However, the stress profile may also apply the same type of stress (e.g., tensile or compressive) in different degrees for the first and second stress conditions. The stress conditions may be alternating or repeating profiles until the trench is filled. For example, the first stress condition applied may be tensile stress, the second stress condition may be compressive stress, and the third stress condition may be tensile stress, with each stress condition alternating until the trench is filled.

In another embodiment, the stress in the trench may be gradually modulated from any depth of the trench, such as from the middle to the top of the trench. Compressive stress may occur in the middle of the trench while gradually applying tensile stress through to the top of the trench. Alternatively, tensile stress may occur in the middle and compressive stress may be applied gradually to the top of the trench. There are various different alternative modulated stress profiles that may be applied whereby the STI structure has sequentially modulated stress in the vertical axis of the trench.

Modulation of the stresses in the STI may be achieved by varying the backside helium pressure to control the substrate temperature during STI deposition. By varying the substrate temperature during the STI deposition, the hydrogen content in the deposited film and silicon lattice of the substrate are modulated accordingly to achieve tensile stress in the deposited STI film after post deposition treatments. The pressure may be varied in any known manner, such as a step-by-step variation and/or gradually ramped in each stress profile modulation layer to achieve the desired stress condition.

A more detailed description of the method of forming an STI feature will be described below with reference to FIG. 1.

Process

FIG. 1 is a flowchart illustrating a method of forming an STI feature in accordance with the present invention. This flowchart is representative and may not encompass all possible embodiments. The following is a detailed description of the processes outlined in the flowchart.

A substrate, having a trench to be filled, is positioned in an HDP reaction chamber at 100. The STI aspect ratio (depth of trench/width of trench) may be less than about 5:1, less than about 7:1, or even about 10:1 or more. The trench is partially filled with a portion of deposited dielectric at 102 using a high density plasma chemical vapor deposition process. The conditions of the process are configured to produce a first stress condition in the first portion of the deposited dielectric at 104. The deposition process condition may then be modified to produce a different stress condition in deposited dielectric at 106. The partially-filled trench may be further filled using the modified deposition process to produce additional dielectric having the different stress condition at 108 and can be repeated at 110 until the trench is filled.

Figure 2:
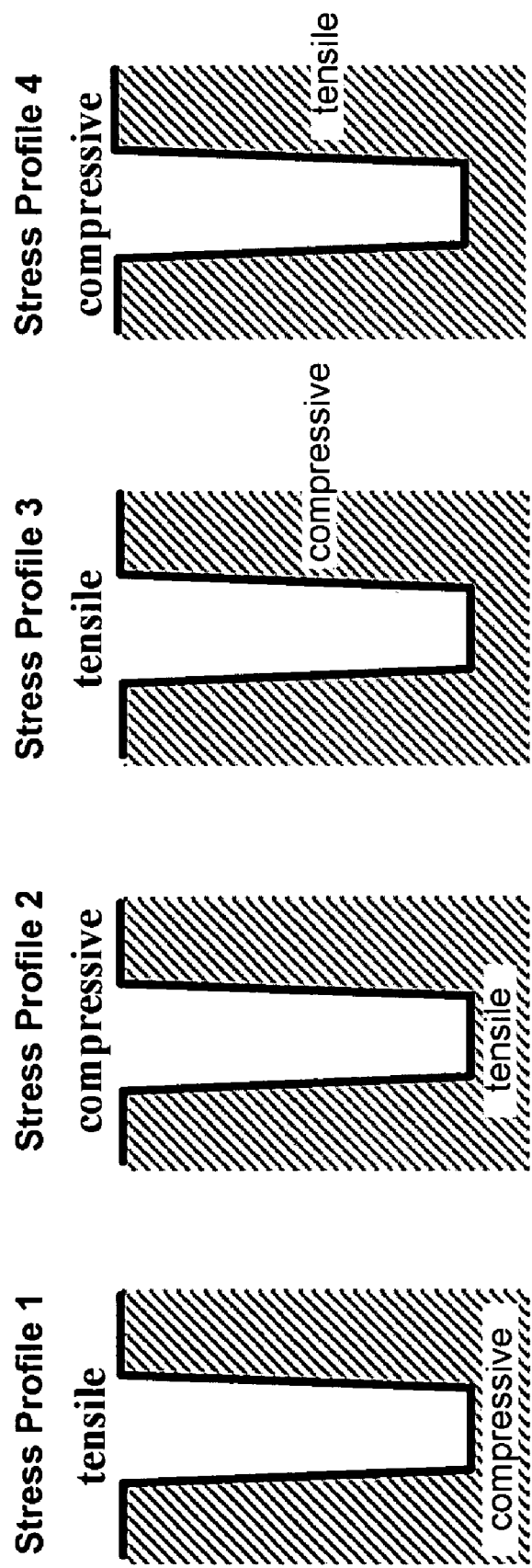
FIG. 2 illustrates various embodiments for modulating stress profiles in an STI in accordance with embodiments of the present invention.

FIG. 2 illustrates various embodiments for modulating stress profiles in an STI in accordance with embodiments of the present invention. The stress conditions applied to the deposited dielectric may either be compressive stress or tensile stress as described above. Additionally, the stresses may be sequentially modulated such that a user may apply a stress in any profile desired. For exemplary purposes only and not intended to be limiting, the first stress condition applied may be compressive stress 202 and a second stress condition applied may be tensile stress 204 as illustrated in Stress Profile 1 or vice versa as illustrated at Stress Profile 2. However, the stress profile may also apply the same type of stress (e.g., tensile or compressive) in different degrees for the first and second stress conditions. The stress conditions may be alternating or repeating profiles until the trench is filled. For example, the first stress condition applied may be tensile stress, the second stress condition may be compressive stress, and the third stress condition may be tensile stress, with each stress condition alternating until the trench is filled.

In another embodiment, the stress in trench 208, 210 may be gradually modulated from any depth of the trench, such as from the middle 212 to the top 214 of trench 208, 210. As illustrated with Stress Profile 3, compressive stress may occur in the middle 212 with tensile stress gradually applied through to the top 214 of the trench 208. Alternatively, as illustrated with Stress Profile 4, tensile stress may occur in the middle 212 and compressive stress may be gradually applied through to the top 214. As will now be realized, there are various different alternative modulated stress profiles that may be applied whereby the STI structure has sequentially modulated stress in the vertical axis of the trench.

In general for HDP methods, hydroxyl formation increases with decreasing substrate temperature. Alternatively, hydroxyl formation may also be increased by decreasing low frequency RF (LFRF) source power, decreasing high frequency RF (HFRF) power and/or increasing substrate to inductive coil distance. In specific embodiments, stress profile modulation in accordance with the present invention can be achieved by modifying the substrate temperature during dielectric deposition. HDP deposition occurring at temperatures in excess of 400° C., for example about 500-700° C., results in the formation of films having compressive stress. HDP CVD conducted at lower temperatures, below 400° C., e.g., below 250° C., for example about 150° C., results in the formation of films which incorporate hydroxyl (OH) groups. In general, the lower the temperature, the more OH groups are incorporated in the deposited film. Post-deposition annealing of the low temperature deposited film, for example by thermal or plasma-based treatment, removes OH groups thereby generating tensile stress. Variance of the deposition temperature and anneal conditions can be used to control the ultimate stress in the completed film. In specific embodiments, deposited film stress is controlled by substrate temperature that is in turn controlled by backside helium pressure. Alternatively, the substrate temperature can be controlled by resistive heating and coolant cooling of the chuck.

HDP CVD conditions are described in general in a variety of commonly assigned issued and pending applications, such as Ser. Nos. 10/316,987, 10/890,655 and 10/991,890. The details of HDP CVD deposition processes disclosed in these applications is incorporated herein by reference and provide guidance with regard to the other basic conditions to be used in suitable HDP CVD processes in accordance with the present invention.

In general, the deposition process gas will include a dielectric precursor such as $SiH_4$, $SiF_4$, $Si_2H_6$, TEOS (tetraethyl orthosilicate), TMCTS (tetramethyl-cyclotetrasiloxane), OMCTS (octamethyl-cyclotetrasiloxane), methyl-silane, dimethyl-silane, 3MS (trimethylsilane), 4MS (tetramethylsilane), TMDSO (tetramethyl-disiloxane), TMDDSO (tetramethyl-diethoxyl-disiloxane), DMDMS (dimethyl-dimethoxyl-silane) and mixtures thereof. During deposition, the process decomposes the silicon-containing reactant to form a silicon-containing gas and plasma phase species, which can react on the surface of the substrate. Oxygen to form the silicon oxide or other dielectric material may be provided by the silicon-containing precursor itself or from another process gas such as elemental oxygen ($O_2$), nitric oxide (NO), and/or nitrous oxide ($N_2O$).

Typical flow rate ranges for deposition process gases are listed below.

| Gas | Flow Rate (sccm) |
|---|---|
| $SiH_4$ | 10-250 |
| $O_2$ | 10-1000 |
| $H_2$ | 0-1500 |
| He | 0-500 |
| Ar | 0-100 |

Generally, other oxygen and silicon-containing compounds can be substituted for those listed in this table. Depending upon the atom counts in the precursor gases, the flow rate ranges may have to be changed. While there are no precise rules for modifying flow rates as a function of molecular structure, generally the flow rate of the silicon-containing precursor may be reduced by a factor corresponding to the number of silicon atoms in the molecule. So, for example, if the molecule contains two silicon atoms, one may expect to reduce the flow rate of the silicon-containing precursor to a level of between about 5 and 125 sccm.

For doped dielectrics, the process gas may include a dopant precursor such as a boron-containing gas, a phosphorus-containing gas, or a mixture thereof. In a specific embodiment, the gas includes one or more boron-containing reactants and one or more phosphorus-containing reactants and the dielectric film includes a phosphorus- and boron-doped silicon oxide glass (BPSG). Examples of suitable boron and phosphorus precursor gases include the following: $B_2H_6$ and $PH_3$.

If the dielectric is to contain an oxyfluoride (e.g., silicon oxyfluoride), then the process gas preferably includes a fluorine-containing reactant such as silicon hexafluoride ($SiF_4$). If the dielectric is to contain an oxynitride (e.g., silicon oxynitride), then the process gas preferably includes a nitrogen-containing reactant such as $N_2$, $NH_3$, $NF_3$, NO, $N_2O$, and mixtures thereof.

Reactor pressure is held at a value necessary to sustain the high-density plasma. Preferably the process vessel is maintained at a pressure of at most about 100 mTorr. In some cases, the process chamber pressure is maintained below 1 mTorr. For many applications, however, the pressure is maintained between about 1 and 100 mTorr; most preferably between about 1 and 30 mTorr.

The low frequency power applied to the upper electrode (for generating the plasma) typically varies from 1 kW to 20 kW, and the high frequency power (for biasing the wafer) typically reaches at least about 0.2 W/cm$^2$ (preferably varying from about 0.5 kW to 10 kW) depending on the substrate size (e.g., 200 or 300 mm diameter) and the requirements of the specific process being used.

As indicated above, the bias applied to the substrate is typically a radio frequency bias. Applying radio frequency bias to the substrate involves supporting the substrate on a substrate holder having an electrode supplying a radio frequency bias to the substrate. For many embodiments, the radio frequency bias applied to the substrate is at the frequency range of between about 100 kHz and 27 MHz. The frequency range applied to the upper, plasma-generating electrode is typically between about 300 kHz and 27 MHz.

The temperature within the process vessel should be maintained sufficiently high to ensure that the dielectric deposition reaction proceeds efficiently. Hence, the temperature preferably resides at values between about 30 and 1000° C. This temperature will vary depending upon the types of precursors employed in the reaction and the extant to which hydroxyl incorporation in the deposited dielectric is desired. Further, the temperature may be limited by process constraints, such as thermal budget limitations that preclude temperatures above 700-750° C. Such constraints become increasingly common with advanced technologies and corresponding smaller feature sizes. As noted above, HDP deposition occurring at temperatures in excess of 400° C., for example about 500-700° C., results in the formation of films having compressive stress. HDP CVD conducted at lower temperatures, below 400° C., e.g., below 250° C., for example about 150° C., results in the formation of films which incorporate hydroxyl (OH) groups. In general, the lower the temperature, the more OH groups are incorporated in the deposited film. Post-deposition annealing of the low temperature deposited film, for example by thermal or plasma-based treatment, removes OH groups thereby generating tensile stress.

Figure 3:
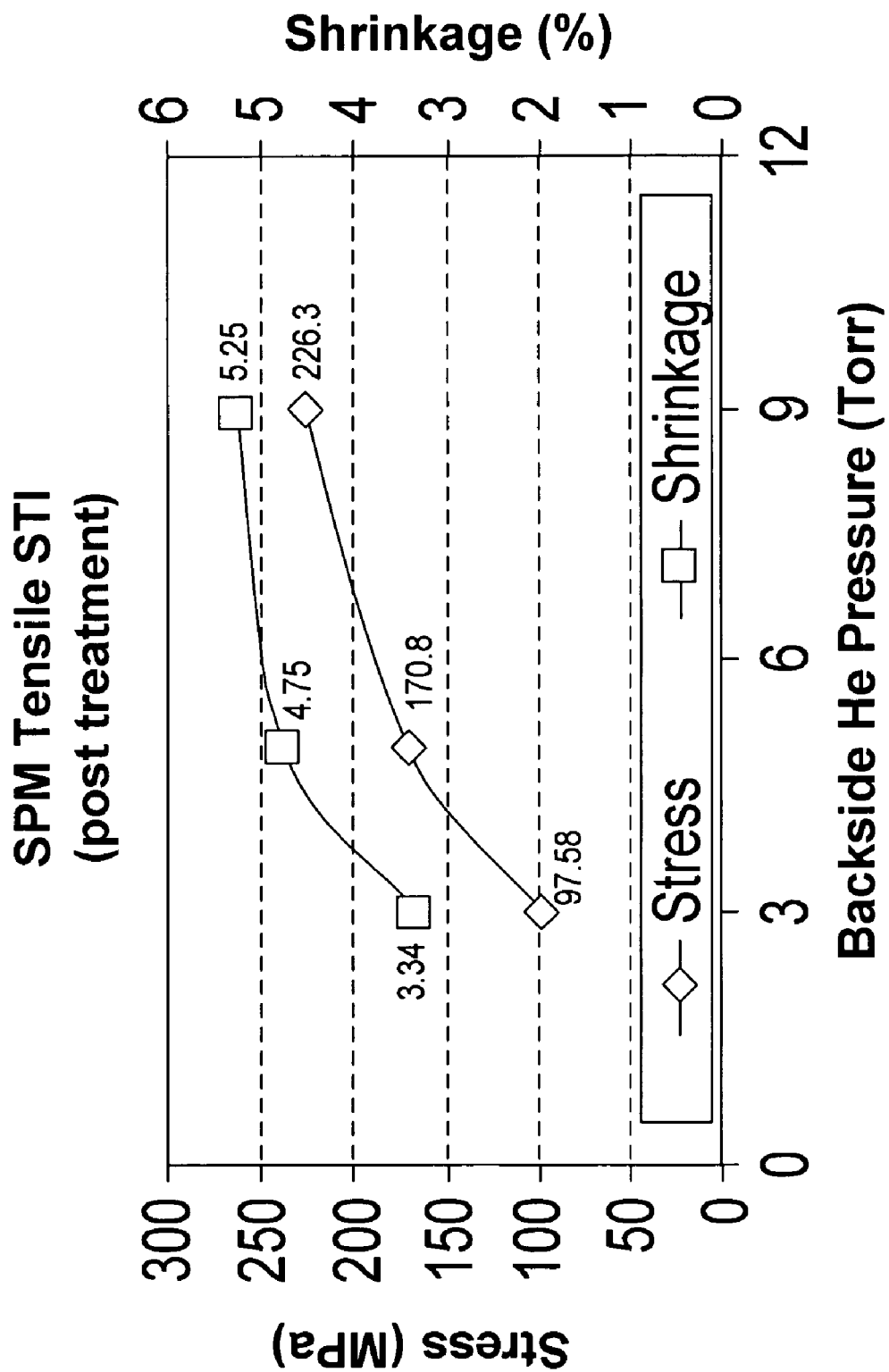
FIG. 3 is a graph illustrating the relationship of the backside helium pressure to compression and tensile stress in accordance with embodiments of the present invention.

FIG. 3 is a graph illustrating the relationship of the backside helium pressure to tensile stress and shrinkage in deposited oxide in accordance with embodiments of the present invention. Modulation of the stresses in a deposited dielectric (e.g., STI) may be achieved by varying the backside helium pressure to control the substrate temperature during dielectric deposition. The pressure may be varied in any known manner, such as a step-by-step variation and/or gradually ramped in each stress profile modulation layer to achieve the desired stress condition. The temperature of the substrate will decrease as the backside helium pressure increases. In accordance with the invention, the substrate temperature during the tensile film deposition is well below 400° C., e.g., below 250° C., and perhaps about 150° C.

As illustrated in FIG. 3, as the pressure increases (e.g., to about 5-9 Torr) and therefore the substrate temperature decreases, so does the oxide shrinkage and associated tensile stress in the oxide filling the trench. At a lower substrate temperature, the silicon lattice of the substrate shrinks and there is additional hydroxyl content in the deposited film. Upon a subsequent post-deposition treatment, such as a thermal or plasma-based anneal, additional hydroxyl content is released from the deposited film. Therefore, the deposited film shrinks and produces a tensile stress in the STI, for example.

Any of a number of suitable methods or combination of methods may be used to remove hydroxyl groups from the dielectric film to create a film having tensile stress, including plasma methods, thermal methods, radiation exposure methods or a combination thereof. In preferred embodiments, a high density plasma or a thermal method is used. This is in part because HDP and thermal methods can typically performed in the same chamber as the previous deposition process and will thereby save time.

If a post-deposition HDP treatment is used, the HFRF power will preferably be off or very low so as to prevent ion bombardment of the deposition film. Conditions that allow too much ion bombardment can cause the film to revert to a compressive film by adding further Si—O bonds in the film via a bond insertion mechanism. The low frequency (LFRF) power is also preferably low enough to prevent too much ion bombardment but should be high enough to efficiently remove water. For a 200 mm wafer, the LFRF will typically be between about 7000 and 8000 Watts. Treatment times may vary depending upon the LFRF power and substrate temperature. For example, a treatment using a substrate temperature between about 500 and 600° C. and LFRF power between about 7000 and 8000 Watts will typically require a treatment time less than about 60 seconds. A treatment using a substrate temperature no more than about 400° C. and LFRF power between about 7000 and 8000 Watts will typically require a treatment time no more than about 180 seconds. The high density plasma is preferably comprised of inert gas/gases such as helium, argon $CO_2$, $N_2$ or a combination thereof. In preferred embodiments, the substrate temperature ranges between about 300 and about 800° C.

For embodiments where a thermal process is used to remove water, the substrate temperature preferably ranges between about 300 and about 1000° C. In preferred embodiments, the thermal treatment can occur in an inert environment such as under vacuum or in the presence of an inert gas such as helium, argon, $CO_2$, $N_2$ or a combination thereof. Alternatively, the thermal treatment can occur in the presence of a non-reducing gas, for example in the presence of oxygen. It is preferable that reducing gases, such as hydrogen, not be used since they may react with the film. The use of an inert or non-reducing gas can inhibit the water removal process. While not wishing to be bound by theory, it is believed that the gas lingers and effectively creates a seal over the substrate and reduces water removal efficiency. Oxygen, in particular, has been found to have a relatively strong suppression effect. Thus, one can tune the amount and/or rate of water removal (i.e., tune the amount of stress induced in the film) by controlling the amount of inert or non-reducing gas. The duration of the thermal treatment can vary broadly depending upon substrate temperature, gas pressures, other process conditions and desired resultant film stress. Preferable treatment times are less than about 2 hours, more preferably less than about 1 hour.

Figure 4:
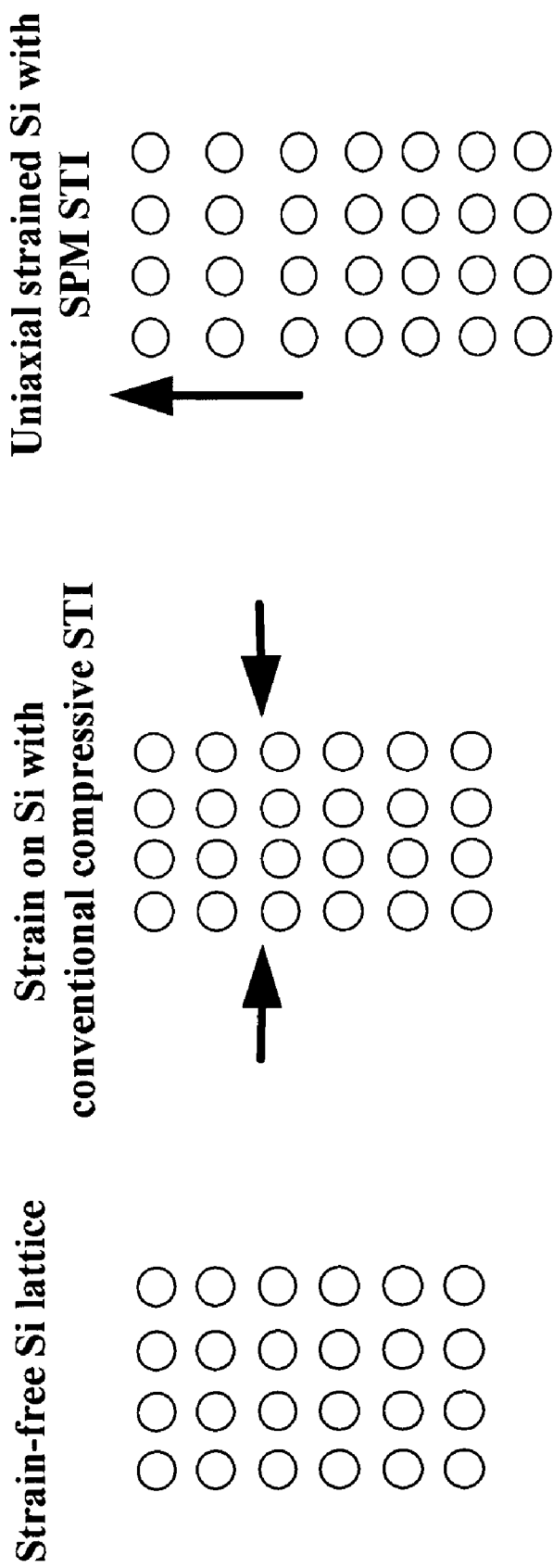
FIG. 4 is a diagram comparing the various stresses on an STI in accordance with embodiments of the present invention.

FIG. 4 is a diagram comparing the various stresses on a STI in accordance with embodiments of the present invention. Strain-free Si lattice 402 and conventional compressive strained STI 404 are illustrated. These conventional stresses on STI structures impose undesired strain on the silicon that degrades the electron mobility. However, the present invention provides for an STI with sequentially modulated stress and shrinkage 406 in the vertical direction to enable uniaxial strain engineering on adjacent silicon islands where the transistors are built. Gap fill capabilities in tensile STI structures of the present invention have been demonstrated down to 45 nm node designs.

Applications

As mentioned previously, methods of the invention may be used to produce sequentially modulated stress profiles in oxide films in a number of front-end-of-line (FEOL) integrated circuit applications. Using methods of the invention, STI stress profiles may be modulated to create global strain (uniform strain throughout the device) or local strain (selected regions of strain), as well as uniaxial strain (stress imparted in one surface direction) or biaxial strain (stress imparted in both surface directions). It is generally desirable to impart tensile stress, in the channel region of NMOS structures since this increases electron mobility while it is generally desirable to impart compressive stress in the channel region of PMOS structures since this increases hole mobility. Thus, a user may modulate the stresses of an STI to impart tensile and compressive strain in channel regions of NMOS and PMOS transistors to optimize device performance.

Figure 5:
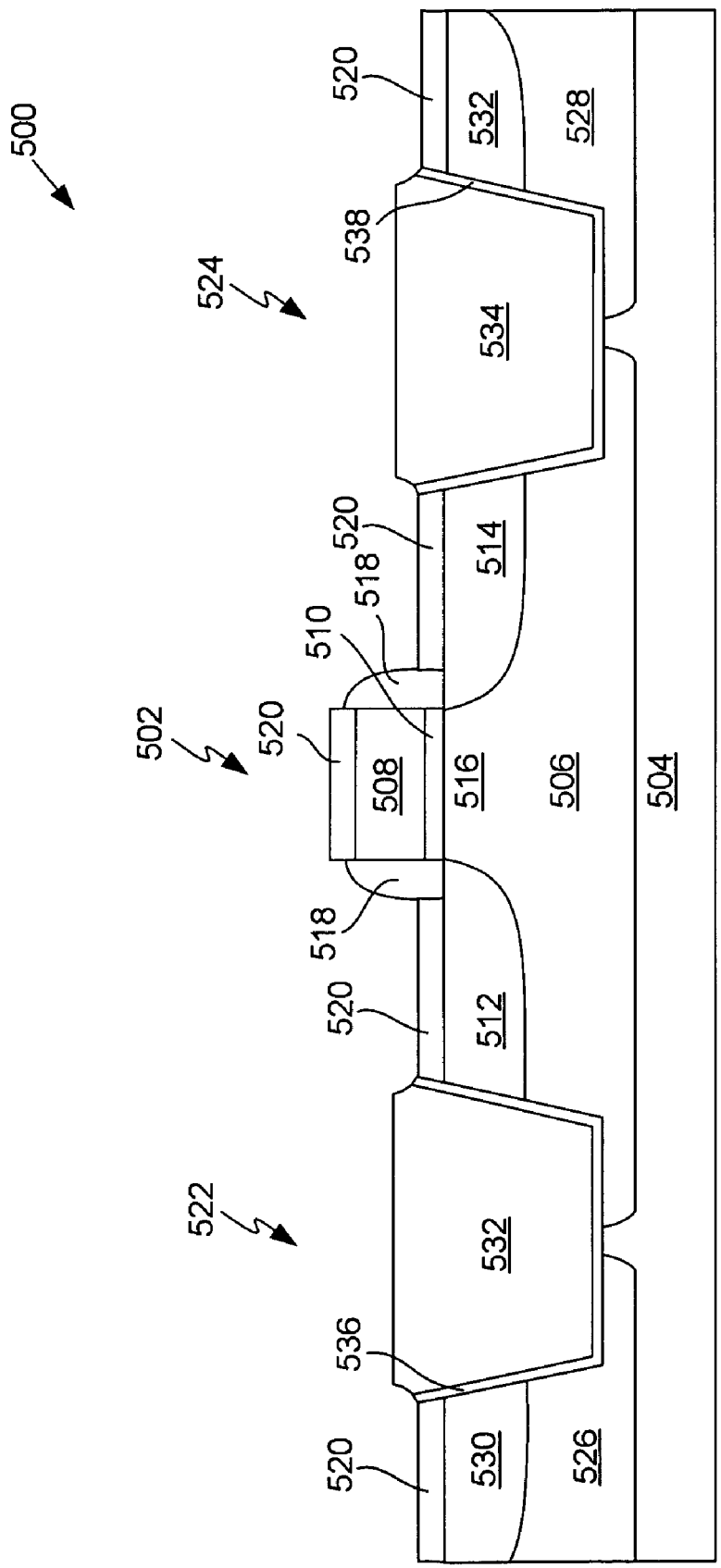
FIG. 5 illustrates a simple transistor architecture in accordance with embodiments of the present invention.

The following description, along with FIG. 5 provides a specific example application of the present invention. FIG. 5 illustrates a CMOS device with STI structures having sequentially modulated stress profiles. The following implementations may be used alone or in combination. For example, methods of the invention may be used to form one or more STI structures, PMD layers and SOI structures in one device. These example applications are provided to exemplify and more clearly illustrate aspects of the present invention and is in no way intended to be limiting.

FIG. 5 illustrates a simple transistor architecture of CMOS device 500 in accordance with the present invention. The CMOS device 500 has NMOS transistor 502 over epitaxial oxide 504. NMOS transistor 502 is composed of an p-doped well 506, a conductive gate 508 separated from the p-doped well 506 by a gate dielectric 510, a n-doped source 512 and a n-doped drain 514. A np-type channel region 516 lies under gate 508. There may also be sidewall spacers 518 on gate 508. The source 512, drain 514 and gate 508 are covered with a layer of self-aligned silicide (salicide) 520. Note that in some cases salicide 520 may additionally be covered with a silicon nitride capping layer (not shown). STI structures 522 and 524 lie on either side of NMOS transistor 502 and isolate NMOS transistor 502 from wells 526 and 528 and source 532 and drain 530 of adjacent transistor structures. STI structures 522 and 524 may also have thin thermal oxide trench liners 536 and 538 that were deposited prior to deposition of the oxides 532 and 534. STI structures 522 and 524 comprise oxides 532 and 534, respectively, having sequentially modulated stress profiles. Oxides 532 and 534 were deposited using the HDP methods in accordance with embodiments of the invention. By modifying the HDP method as described above, sequentially modulated compressive and/or tensile strain may be created in the vertical axis of oxides 532 and 534 thereby allowing a fine degree of control and mobility of electrons in the channel region 516.

Apparatus

The present invention is implemented in a high density plasma chemical vapor deposition (HDP-CVD) reactor. Such a reactor may take many different forms. Generally, the apparatus will include one or more chambers or "reactors" (sometimes including multiple stations) that house one or more wafers and are suitable for wafer processing. Each chamber may house one or more wafers for processing. The one or more chambers maintain the wafer in a defined position or positions (with or without motion within that position, e.g. rotation, vibration, or other agitation). In some embodiments, silicon oxide deposition and treatment occur in one reactor. In other embodiments, a wafer undergoing silicon oxide deposition and treatment is transferred from one station to another within the reactor during the process. While in process, each wafer is held in place by a pedestal, wafer chuck and/or other wafer holding apparatus. For certain operations in which the wafer is to be heated, the apparatus may include a heater such as a heating plate. Examples of suitable reactors include the Speed™ reactor, available from Novellus Systems of San Jose, Calif., and the Ultima™ reactor, available from Applied Materials, Inc. of Santa Clara, Calif.

The principal components of most suitable reactors include a reaction chamber, a process gas delivery system, a support for the substrate, one or more electrodes or radio frequency power source coupled to an induction coil to generate an inductively coupled plasma, and a bias source for the substrate. A temperature control system is typically used to heat the substrate. Suitable plasma processing reactors are described, for example, in U.S. Pat. Nos. 5,346,578, 5,405, 480 and 5,605,599, the disclosures of which are incorporated by reference herein in their entirety and for all purposes.

FIGS. 6A-6B is a schematic representation of high density plasma apparatus suitable for methods in accordance with embodiments of the invention. FIG. 6A is a vertical cross-section block diagram depicting some components of a suitable plasma processing reactor suitable for conducting a gap fill on semiconductor wafers. As shown, the reactor 601 includes a process chamber 603 which encloses other components of the reactor and serves to contain the plasma generated by the radio frequency power source coupled to the induction coil 605, which surrounds the chamber on or embedded in the chamber walls. In one example, the process chamber walls are made from aluminum, aluminum oxide, and/or other suitable material. The coil 605 is powered by a "low frequency" radio frequency (RF) source 606. The power and frequency supplied by source 606 is sufficient to generate high-density plasma from the process gas.

Within the reactor, a wafer pedestal 607 supports a substrate 609. The pedestal typically includes a chuck (sometimes referred to as a clamp) to hold the substrate in place during the deposition reaction. The chuck may be an electrostatic chuck, a mechanical chuck or various other types of chuck as are available for use in the industry and/or research.

A heat transfer subsystem including a line 611 for supplying a heat transfer gas controls the temperature of substrate 609. In some embodiments, the heat transfer fluid comprises at least one of helium and argon gas. The heat transfer fluid is supplied to a space 613 between the surface of the substrate and a surface of the chuck.

A "high frequency" RF source 615 serves to electrically bias substrate 609 and draw charged precursor species onto the substrate for the deposition reactions. Electrical energy from source 615 is coupled to substrate 609 via an electrode or capacitive coupling, for example. Note that the bias applied to the substrate need not be an RF bias. Other frequencies and DC bias may be used as well. In a specific embodiment, source 615 supplies a radio frequency bias to the substrate with a power ranges from 0.5 kW to 10 kW.

The process gases are introduced via one or more chamber inlets 617. The gases may be premixed or not. Other sources of dielectric precursor gases and carrier gases are also provided. Preferably, the process gas is introduced through a gas supply inlet mechanism including orifices. In some embodiments, at least some of the orifices orient the process gas along an axis of injection intersecting an exposed surface of the substrate at an acute angle. Further, the gas or gas mixture may be introduced from a primary gas ring, which may or may not direct the gas toward the substrate surface. In this embodiment, a ring inlet(s) 618 is connected to the primary gas ring 619 to supply gas or gas mixture into the chamber via the chamber inlets 617. This arrangement is further illustrated in the horizontal cross-section of FIG. 6B which depicts a ring inlet and eight chamber inlets for process gas. Note that inlets, gas rings or other mechanisms for supplying process gas to the reactor process chamber are not critical to this invention. The sonic front caused by the gas entering the chamber will itself cause the gas to rapidly disperse in all directions—including toward the substrate.

The process gas exits the chamber 603 via an outlet or outlets 620. A vacuum pump (e.g., a turbomolecular pump) or pumps 622 typically draws the gas out and maintains a suitably low pressure within the reactor.

As noted above, the gap fill process of the present invention is preferably accomplished in a single reactor process chamber, but it may also be accomplished in a plurality of processing chambers. When more than one processing chamber is used, a pressure controlled transfer module should be used to transfer the wafers from one chamber to another. Such transfer modules and procedures are known to those skilled in the art.

Reactor pressure is held at a value necessary to sustain the high-density plasma. Preferably the process vessel is maintained at a pressure of at most about 30 mTorr. For many applications, however, the pressure is maintained between about 3 and 20 mTorr; most preferably between about 5 and 20 mTorr. In one embodiment of the invention, the pressure is maintained at about 15 mTorr during the deposition process and about 5 mTorr during the post-deposition treatment.

For a typical apparatus, the low frequency power applied to the upper electrode (for generating the plasma) can typically vary from 1 kW to 20 kW, and the high frequency power (for biasing the wafer) can typically reach at least about 0.1 W/cm$^2$. Note that preferred RF power will depend on the substrate size (e.g., 200 or 300 mm diameter) and the requirements of the specific process being used.

The bias applied to the substrate is typically a radio frequency bias. Applying radio frequency bias to the substrate involves supporting the substrate on a substrate holder having an electrode supplying a radio frequency bias to the substrate. For many embodiments, the radio frequency bias applied to the substrate is at the frequency range of between about 100 kHz and 27 MHz. The frequency range applied to the upper, plasma-generating electrode is typically between about 100 kHz and 27 MHz.

EXAMPLE

A series of HDP CVD SiO$_2$ layers were deposited with conditions progressively changed to generate compressive to tensile stress in the resulting composite film. For layer 1, no backside He flow was used and the wafer temperature exceeded 400° C. Six additional layers were applied on the first layer with stepwise increases in the backside He pressure as follows: Layer 2, 1 Torr; layer 3, 2 Torr; layer 4, 3 Torr; layer 5, 4 Torr; layer 6, 5 Torr; and layer 7, 6 Torr. The lower layers exhibited compressive stress while the topmost layers exhibited tensile stress.

CONCLUSION

Although the foregoing invention has been described in some detail for purposes of clarity of understanding, it will be apparent that certain changes and modifications may be practiced within the scope of the appended claims. It should be noted that there are many alternative ways of implementing both the process and compositions of the present invention. Accordingly, the present embodiments are to be considered as illustrative and not restrictive, and the invention is not to be limited to the details given herein. All references cited herein are incorporated by reference for all purposes.

The invention claimed is:

1. A method of forming a shallow trench isolation (STI) feature, the method comprising:
   (a) providing a substrate having a trench to be filled in a reaction chamber, the reaction chamber capable of maintaining a high density plasma;
   (b) partially filling the trench on the substrate with a first portion of deposited dielectric using a high density plasma chemical vapor deposition process having conditions configured to produce a first stress condition in the first portion of deposited dielectric;
   (c) modifying a deposition process condition to produce a different stress condition in deposited dielectric; and
   (d) further filling the partially-filled trench using the modified deposition process to produce additional dielectric;
   whereby the STI feature having sequentially modulated stress in the axis of the trench results.

2. The method of claim 1, wherein the deposition process condition is modified discretely from operations (b) to (d).

3. The method of claim 1, wherein the deposition process condition is modified gradually from operations (b) to (d).

4. The method of claim 1, wherein the further filing of operation (d) fills the trench.

5. The method of claim 1, further comprising repeating operations (c) and (d) until the trench is filled.

6. The method of claim 5, wherein the different stress condition in repeated operation (d) is the same as the first stress condition.

7. The method of claim 5, wherein the different stress condition in repeated operation (d) is different from the first stress condition.

8. The method of claim 1, wherein the modified process condition comprises a substrate temperature.

9. The method of claim 8, wherein the substrate temperature is controlled by resistive heating and coolant cooling of the chuck.

10. The method of claim 8, wherein the substrate temperature is controlled by a backside helium pressure wherein the substrate temperature decreases as the backside helium pressure increases.

11. The method of claim 10, wherein as the backside helium pressure increases, the stress condition of the deposited dielectric is more tensile in character.

12. The method of claim 1, wherein one or more of the HDP CVD processes comprises a post-deposition anneal that imparts a stress condition to the deposited dielectric that is more tensile in character.

13. The method of claim 1, wherein the first stress condition is compressive stress and the different stress condition is tensile stress.

14. The method of claim 13, wherein the first stress condition and the different stress condition are repeated until the trench is filled.

15. The method of claim 1, wherein the first stress condition is tensile stress and the different stress condition is compressive stress.

16. The method of claim 15, wherein the first stress condition and the different stress condition are repeated until the trench is filled.

17. The method of claim 6, wherein the different stress condition and the first stress condition are both tensile stress, each tensile stress having a different degree of stress.

18. The method of claim 6, wherein the different stress condition and the first stress condition are both compressive stress, each compressive stress having a different degree of stress.

19. The method of claim 1, wherein the STI feature is integrated with a metal oxide semiconductor (MOS) transistor device such that the STI feature applies a uniaxial strain on a channel region of the MOS transistor.

20. The method of claim 1, wherein the trench has an aspect ratio of at least 5:1.

21. The method of claim 1, wherein the dielectric is silicon oxide.

22. The method of claim 1, wherein the dielectric is selected from the group consisting of silicon nitride, silicon oxynitride, or doped silicon oxide materials.

* * * * *